(12) United States Patent  
Choraku et al.

(10) Patent No.: US 8,269,104 B2  
(45) Date of Patent: Sep. 18, 2012

(54) WATERPROOF ENCLOSURE AND ELECTRONIC APPARATUS

(75) Inventors: Kohei Choraku, Kawasaki (JP); Satoshi Watanabe, Kawasaki (JP); Shingo Yamaguchi, Kawasaki (JP); Yasuhiro Ite, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 300 days.

(21) Appl. No.: 12/652,980

(22) Filed: Jan. 6, 2010

(65) Prior Publication Data

US 2010/0206601 A1 Aug. 19, 2010

(30) Foreign Application Priority Data

Feb. 16, 2009 (JP) .................................. 2009-32961

(51) Int. Cl.
*H05K 5/06* (2006.01)
(52) U.S. Cl. .......... 174/50.5; 174/50; 220/378; 227/630
(58) Field of Classification Search ................ 174/50.5, 174/50; 220/327, 378; 277/630
See application file for complete search history.

(56) References Cited

U.S. PATENT DOCUMENTS

| 7,763,799 B2 * | 7/2010 | Johnson ......................... 174/67 |
| 7,926,818 B2 * | 4/2011 | Isono ............................ 277/630 |
| 8,013,245 B2 * | 9/2011 | Korcz et al. ................... 174/66 |

FOREIGN PATENT DOCUMENTS

| EP | 1096759 A1 | 5/2001 |
| JP | 11-294593 A | 10/1999 |
| JP | 2000-299725 A | 10/2000 |
| JP | 2007-042842 A | 2/2007 |

OTHER PUBLICATIONS

Office Action issued in Japanese Application No. 2009-032961 dated Jul. 10, 2012 (w/Partial translation) (5 pages).

* cited by examiner

*Primary Examiner* — Dhirubhai R Patel
(74) *Attorney, Agent, or Firm* — Westerman, Hattori, Daniels & Adrian, LLP

(57) ABSTRACT

A waterproof enclosure includes a first enclosure section and a second enclosure section. The first enclosure section has an opening along which a gasket is provided. The gasket has a body section and a lip section protruding from the body section. The second enclosure section is disposed opposite the first enclosure section. The second enclosure section has a planar surface and an inclined surface. The inclined surface of the second enclosure contacts the lip section of the gasket, and the body section of the gasket contacts the planar surface of the second enclosure section.

8 Claims, 10 Drawing Sheets

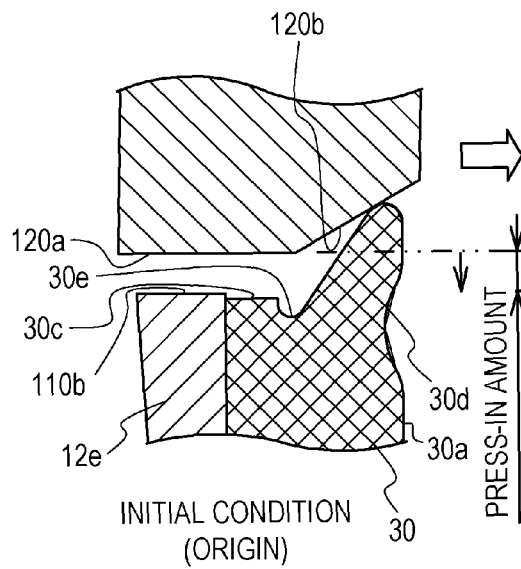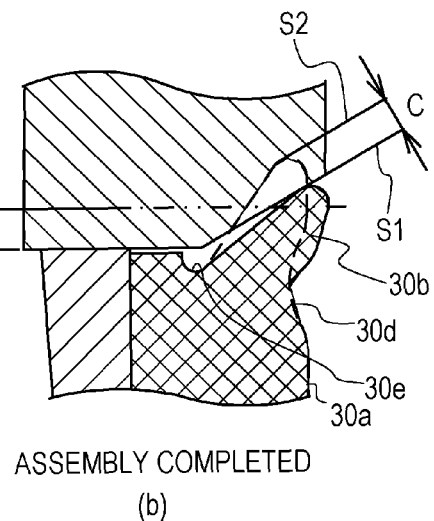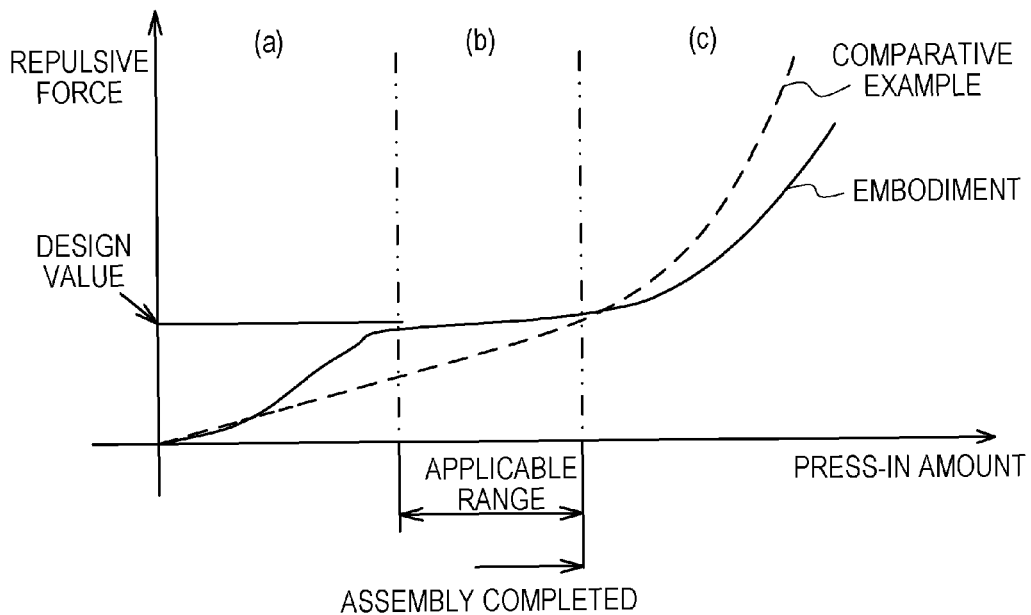

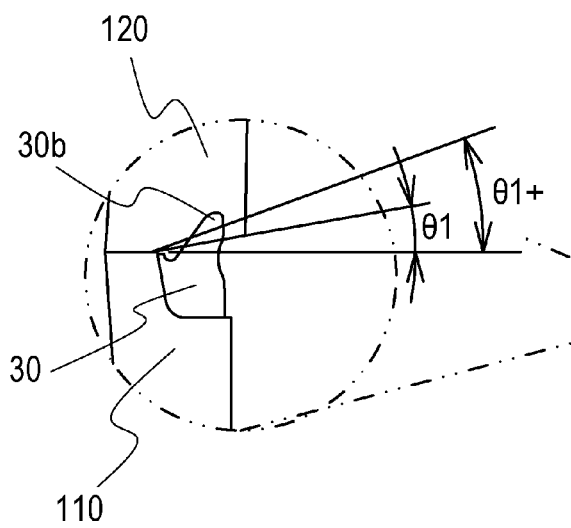
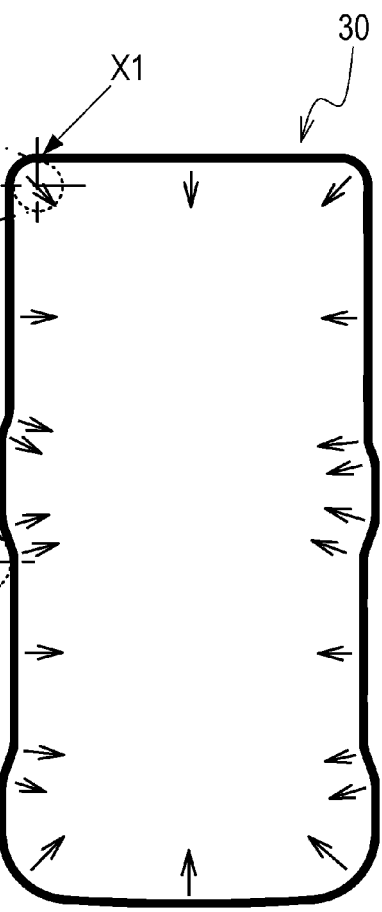
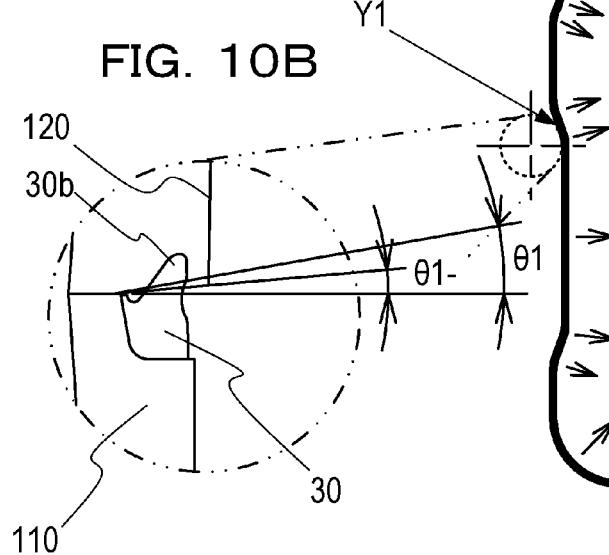
FIG. 10C
FIG. 10A
FIG. 10B

WATERPROOF ENCLOSURE AND ELECTRONIC APPARATUS

CROSS-REFERENCE TO RELATED APPLICATION

This application is based upon and claims the benefit of priority of the prior Japanese Patent Application No. 2009-32961, filed on Feb. 16, 2009, the entire contents of which are incorporated herein by reference.

FIELD

The embodiments discussed herein are related to a waterproof enclosure and an electronic apparatus including the waterproof enclosure.

BACKGROUND

Various seal members and waterproof housing structures allowing containers or enclosures to be closed have hitherto been proposed. For example, Japanese Patent Laid-Open No. 11-294593 describes a seal member that exhibits an excellent sealing property even when the container has a noncircular opening shape such as one including a linear part. Japanese Patent Laid-Open No. 2007-42842 describes a waterproof housing structure allowing a sufficient waterproof property to be maintained over a long period. A structure including an elastomer gasket sandwiched between a first enclosure section and a second enclosure section has been adopted as a waterproof structure for electronic apparatuses and the like. In such a waterproof structure, the gasket is compressed in a fitting direction.

An excellent waterproof property has recently been required even for small-sized enclosures for electronic apparatuses and the like.

However, if the gasket is compressed in the fitting direction, the gasket continues to exert a strong pressing force in a direction in which the enclosure is opened, as a result of the repulsive force of the gasket. Thus, the required strength of the enclosure needs to be ensured. However, it is likely that the strength for small-sized enclosures will be insufficient. Furthermore, as the enclosure is opened under the pressing force of the gasket, the compression amount of the gasket decreases. As a result, opening the enclosure even by a small amount may degrade the waterproof performance. Additionally, the possible friction between the gasket and the enclosure may make assembly of the enclosure difficult. Moreover, the gasket is often arranged like a frame along the outer peripheral edge of the gasket. However, if the outer periphery of the enclosure has a complicated shape, the gasket is expected to fail to be appropriately compressed, thus preventing the desired waterproof property to be ensured.

Such a problem may similarly occur when the seal member is used in a small-sized electronic apparatus or the like.

SUMMARY

According to an embodiment, a waterproof enclosure includes a first enclosure section and a second enclosure section. The first enclosure section has an opening along which a gasket is provided. The gasket has a body section and a lip section protruding from the body section. The second enclosure section is disposed opposite the first enclosure section. The second enclosure section has a planar surface and an inclined surface. The inclined surface of the second enclosure contacts the lip section of the gasket, and the body section of the gasket contacts the planar surface of the second enclosure.

It is to be understood that both the foregoing general description and the following detailed description are exemplary, and do not restrict the invention as claimed.

BRIEF DESCRIPTION OF DRAWINGS

The above and other features and advantages of the present invention will become apparent from the following description of the embodiments in conjunction with the accompanying drawings, wherein:

FIGS. 8A-8C are diagrams illustrating the relationship between the amount by which the second enclosure section is pressed with respect to the first enclosure section and a repulsive force exerted by a lip section;

FIGS. 10A-10C are a plan view of a second gasket according to the present invention and enlarged views of the gasket.

DESCRIPTION OF EMBODIMENTS

Figure 1:
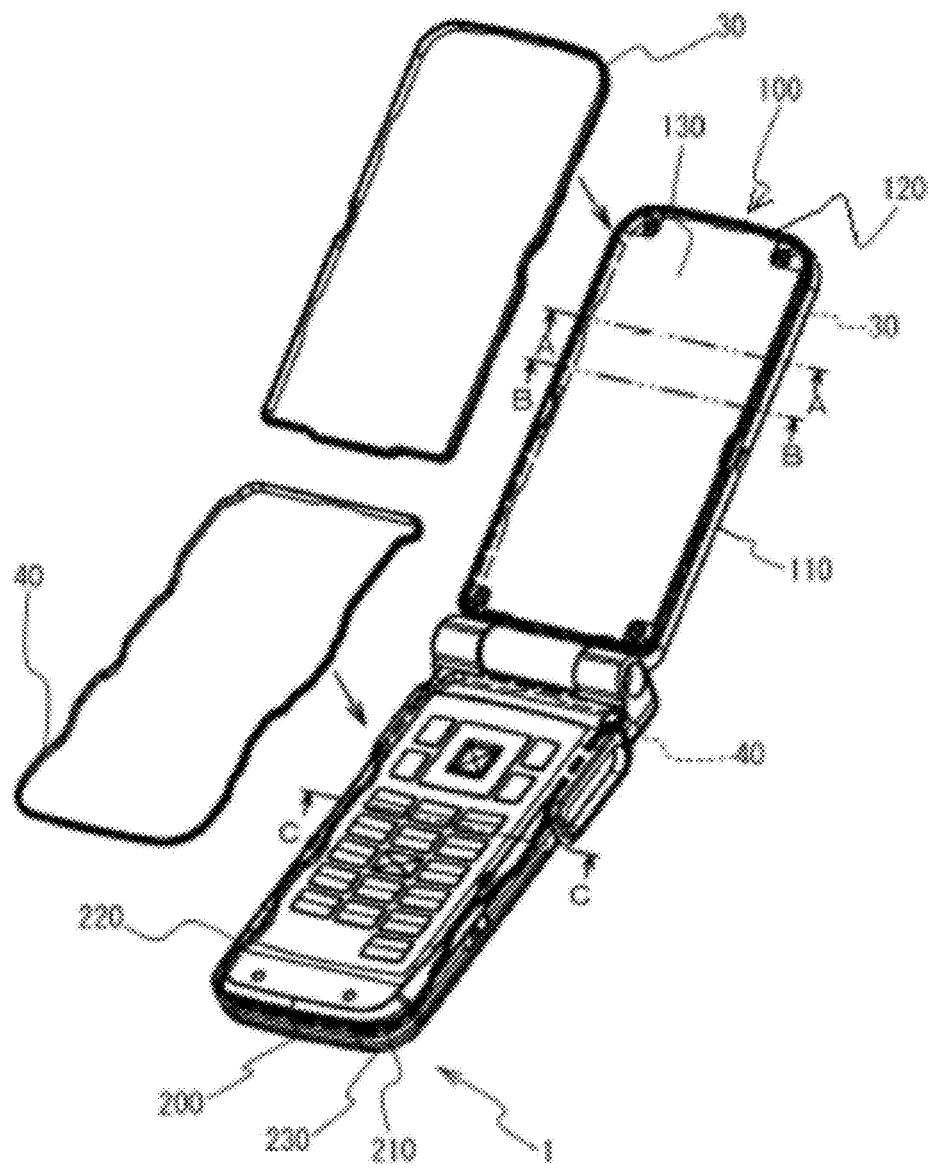
FIG. 1 is a perspective view schematically illustrating the configuration of a cellular phone including a waterproof structure according to a first embodiment of the present invention.

Exemplary embodiments of the present invention will be described below with reference to the accompanying drawings. In the drawings, the dimensions, scales, and the like of components may not be illustrated to be perfectly equal to the actual ones. Furthermore, details are omitted from some of the drawings.

Figure 2:
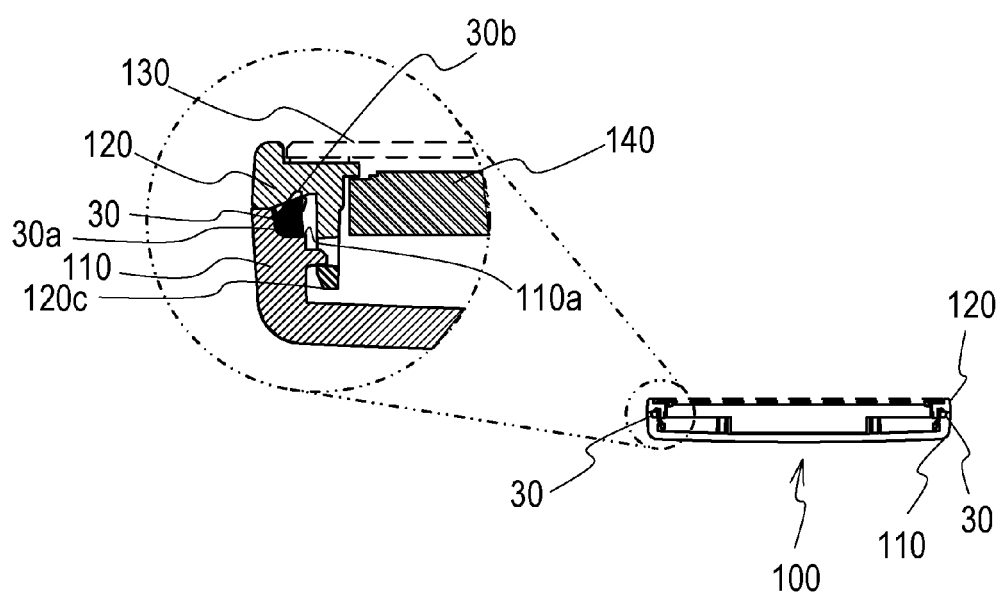
FIG. 2 is a sectional view taken along line A-A in FIG. 1.
Figure 3:
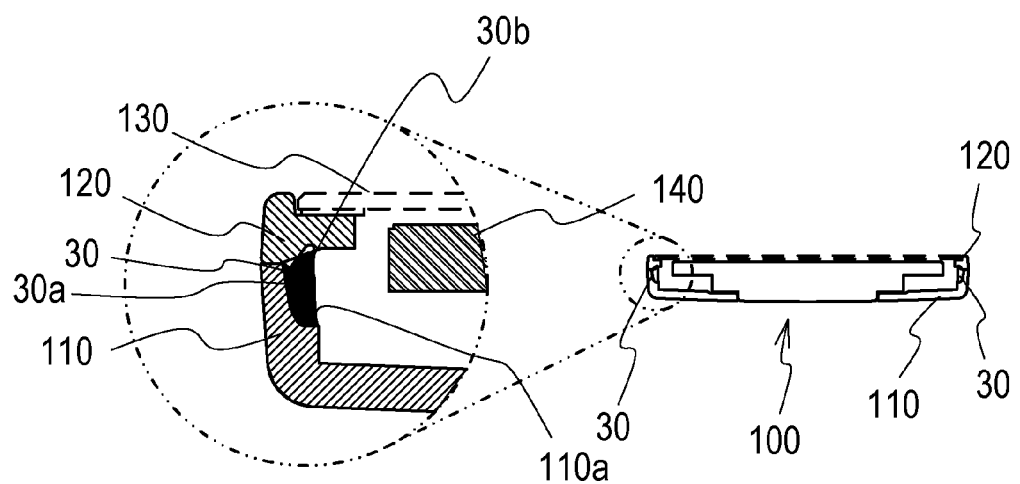
FIG. 3 is a sectional view taken along line B-B in FIG. 1.
Figure 4:
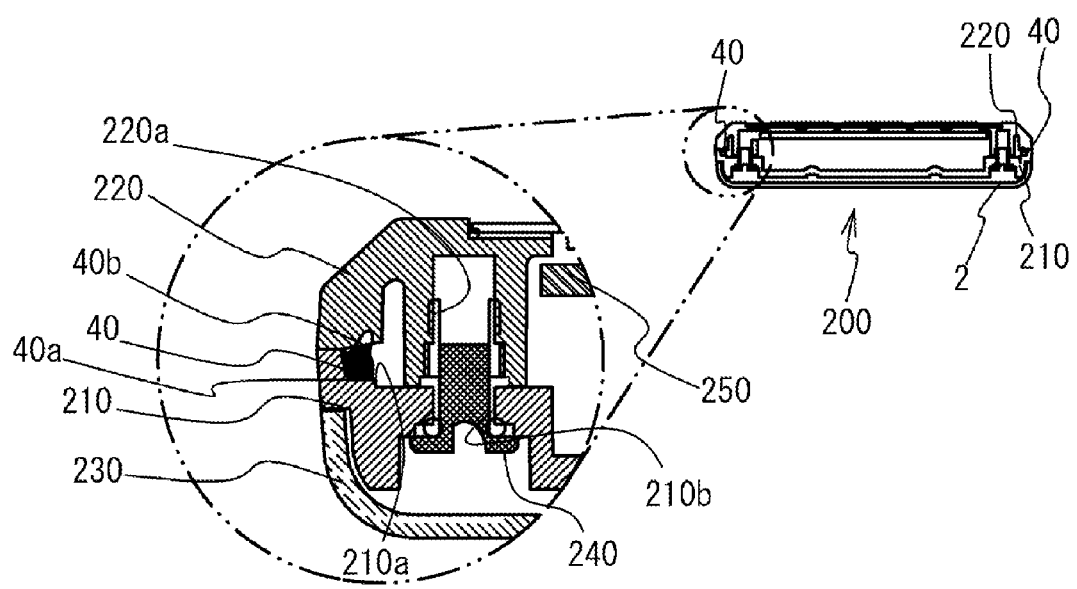
FIG. 4 is a sectional view taken along line C-C in FIG. 1.
Figure 5A:
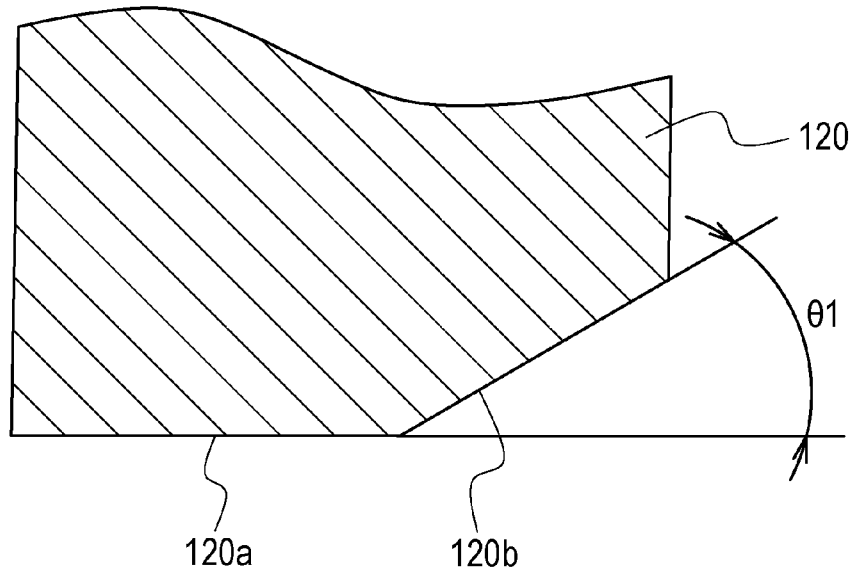
FIGS. 5A and 5B are enlarged schematic diagrams of the periphery of a gasket and an inclined surface, illustrating a first enclosure section and a second enclosure section separated from each other.
Figure 5B:
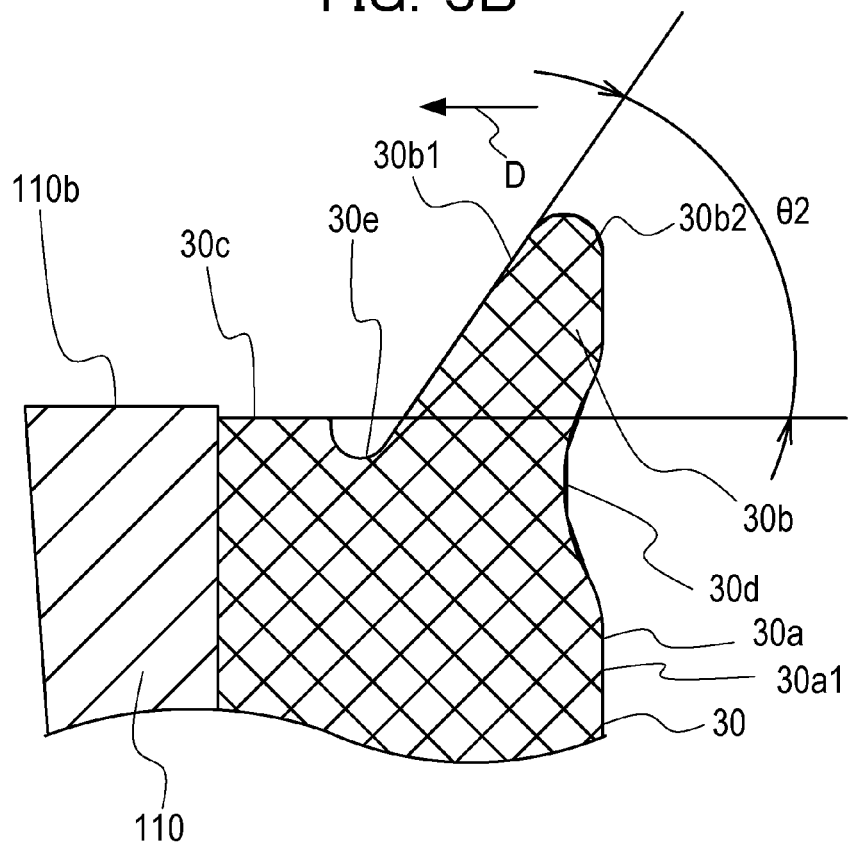

FIG. 1 is a perspective view of a cellular phone 1 including a waterproof structure for an enclosure (hereinafter simply referred to as a "waterproof structure") according to a first embodiment of the present invention. The cellular phone 1 is an example of an electronic apparatus according to the present invention. Furthermore, FIG. 2 is a sectional view taken along line A-A in FIG. 1. FIG. 3 is a sectional view taken along line B-B in FIG. 1. Moreover, FIG. 4 is a sectional view taken along line C-C in FIG. 1. Additionally, FIG. 5B is an enlarged schematic diagram of the periphery of a gasket 30 provided in a first enclosure section 110 and FIG. 5A is an inclined surface 120b formed on a second enclosure section 120, illustrating that the first enclosure section 110 is separated from the second enclosure section 120.

Figure 6:
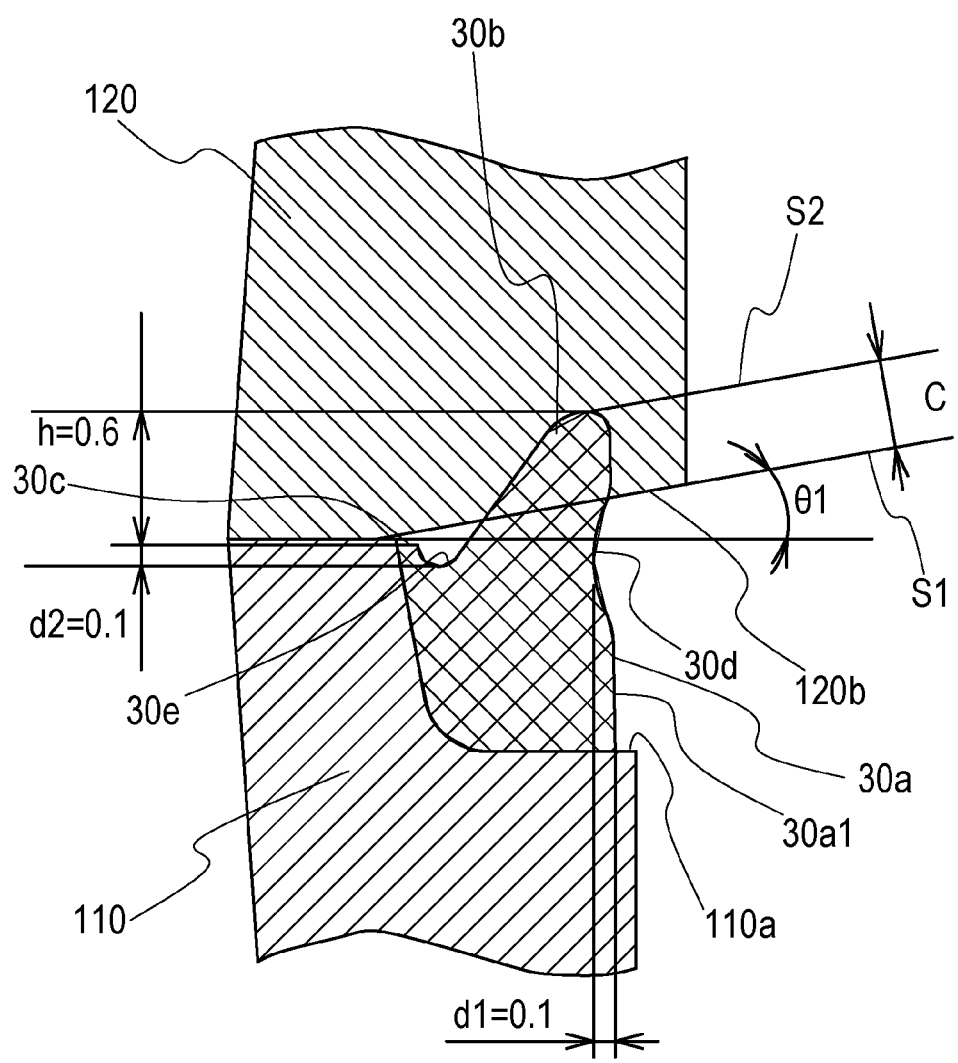
FIG. 6 is an enlarged schematic diagram of the periphery of the gasket and the inclined surface, illustrating the first enclosure section and the second enclosure section combined with each other.

In FIG. 6 illustrating that the first enclosure section 110 is combined with the second enclosure section 120, the lip section 30b and the second enclosure section 120 are illustrated to overlap. However, the lip section 30b is actually inclined internally downward.

As illustrated in FIG. 1, the cellular phone 1 includes an openable and closable enclosure 100 and a fixed enclosure 200 and is foldable. The openable and closable enclosure 100 and the fixed enclosure 200 each include a waterproof structure described below.

As illustrated in FIGS. 2 and 3, the openable and closable enclosure 100 has the first enclosure section 110 including an opening in which a gasket installation portion 110a with a frame-like gasket 30 provided thereon is formed. The first enclosure section 110 has a mating surface 110b that abuts against a mating surface 120a provided on the second enclosure section 120 described below. The mating surface 110b is provided all over the periphery of the first enclosure section 110.

A substrate 140 with an electronic component mounted thereon is housed inside the first enclosure section 110.

Furthermore, the openable and closable enclosure 100 has the second enclosure section 120 disposed opposite the first enclosure section 110 which tightly contacts the gasket 30 provided on the first enclosure section 110. The second enclosure section 120 includes the mating surface 120a abutting against the mating surface 110b provided on the first enclosure section 110 as described above. The mating surface 120a corresponds to a planar portion according to the present invention which is disposed opposite the first enclosure section 110. As illustrated in FIG. 5A, the second enclosure section 120 includes an inclined surface 120b tapered so as to have an angle θ1 to the mating surface 120a. When the first enclosure section 110 and the second enclosure section 120 are combined together, the inclined surface 120b comes into contact with the gasket 30. The inclined surface 120b is provided all over the periphery of the second enclosure section 120.

A transparent panel 130 is installed on the top surface of the second enclosure section 120.

The gasket 30 has a frame-like body section 30a corresponding to the outer peripheral shape of the first enclosure section 110. The gasket 30 is installed in the first enclosure section 110 so that the body section 30a tightly contacts the gasket installation portion 110a provided in the first enclosure section 110.

In the present embodiment, the gasket 30 and the first enclosure section 110 are separately molded, and the gasket 30 is removably installed on the first enclosure section 110. However, the first enclosure section 110 and the gasket may be integrally molded. The first enclosure section 110 and the gasket 30 may be integrally molded using a well-known manufacture method such as an insert molding method or a multicolor molding method.

The gasket 30 includes a lip section 30b that tightly contacts the inclined surface 120b of the second enclosure section 120. The lip section 30b is extended from the body section 30a toward the inside of the first enclosure section 110 so as to have an angle θ2 to an opposite surface 30c of the body section 30a disposed opposite the mating surface 120a of the second enclosure section 120. More specifically, as illustrated in FIG. 5B, the lip section 30b is extended from the body section 30a to form an angle of θ2 between the rear surface 30b1 of the lip section 30b and the opposite surface 30c.

Here, the angle θ2 is desirably at most 90°. The angle θ2 may be 90° or larger, but an angle θ2 of at most 90° allows the lip section 30b to be easily tilted when the inclined surface 120b is pressed against the lip section 30b.

Here, the angle θ2 formed by the lip section 30b is set to be larger than the angle θ1 formed by the inclined surface 120b of the second enclosure section 120. This relationship (θ1<θ2) allows the lip section 30b to overlap the inclined surface 120b. Thus, an appropriate waterproof property is ensured when the first enclosure section 110 and the second enclosure section 120 are combined together.

Furthermore, the inner peripheral edge 30b2 of the lip section 30b is positioned closer to the outside of the first enclosure section 110 than the inner periphery 30a1 of the body section 30a, that is, in a direction illustrated by arrow D in FIG. 5B.

However, this relationship between the inner peripheral edge 30b2 of the lip section 30b and the inner periphery 30a1 of the body section 30a has only to be maintained when the first enclosure section 110 and the second enclosure section 120 are separated from each other. The lip section 30b is pressed and tilted by the inclined surface 120b when the first enclosure section 110 and the second enclosure section 120 are combined together as described below. Thus, when the lip section 30b is tilted, the inner peripheral edge 30b2 may be disposed more inward than the inner periphery 30a1 of the body section 30a.

This relationship between the inner peripheral edge 30b2 of the lip section 30b and the inner periphery 30a1 of the body section 30a is advantageous for ensuring a mounting area in the openable and closable enclosure 100 in which the substrate 140 and the like can be mounted.

The gasket 30 has a groove at the root of the lip section 30b. In the present embodiment, the gasket 30 has a first groove 30d peripherally formed inside the lip section 30b and a second groove 30e peripherally formed outside the lip section 30b.

In the present embodiment, the first enclosure section 110 and the second enclosure section 120 can be completely separated from each other. The first enclosure section 110 and the second enclosure section 120 are connected together, for example, via a hinge.

The first enclosure section 110 and the second enclosure section 120 are combined together via what is called a snap fit structure such that a pawl portion 120c of the second enclosure section 120 is engaged with the first enclosure section 110 as illustrated in FIG. 2.

Now, the dimensions, materials, and the like of components of the gasket 30, the first enclosure section 110, and the second enclosure section 120 according to the present embodiment will be described. The dimensions, materials, and the like can be optionally set according to the product. An example will be described below.

The first enclosure section 110 can be constructed using a well-known material. For example, the material may be an acrylonitrile butadiene styrene resin (ABS resin), a polycarbonate resin, or a composite containing an ABS resin and a polycarbonate resin. If the first enclosure section 110 and the gasket 30 are integrally molded, any of materials that can be molded integrally with the gasket 30 is selected.

As is the enclosure with the first enclosure section 110, the material for the second enclosure section 120 may be an ABS resin, a polycarbonate resin, or a composite containing an ABS resin and a polycarbonate resin. Alternatively, a polyamide resin, a glass fiber reinforced polyamide resin, or the like may be used.

A well-known material can also be used for the gasket 30. In the present embodiment, polyester-containing thermoplastic elastomer is used. Furthermore, the basic physical properties of the material are appropriately selected from the ranges listed below.

Hardness: 50 to 75 [°]
Compression set: 59 to 65 [MPa]
Tensile strength: 6 to 9 [MPa]
Melting point: 145 to 165 [° C.]
Fusion strength: 98 to 265 [N/25 mm]

As described above, the gasket 30 has the first groove 30d peripherally formed inside the lip section 30b and the second groove 30e peripherally formed outside the lip section 30b. The shapes and dimensions of the first groove 30d and the second groove 30e have an effect on the inward tilt of the lip section 30b. Thus, the adjustment of the shapes and dimensions of the first and second grooves 30d and 30e allows the inward tilt of the lip section 30b to be adjusted.

In the present embodiment, as illustrated by a cross section of the gasket 30 in FIG. 6, the depth d1 of the first groove 30d is set to d1=0.1 mm. The depth d2 of the second groove 30e is set to d2=0.1 mm.

Furthermore, the height h of the lip section 30b, that is, the height h from the opposite surface 30c to the top of the lip section 30b, is set to h=0.6 mm.

Figure 7A:
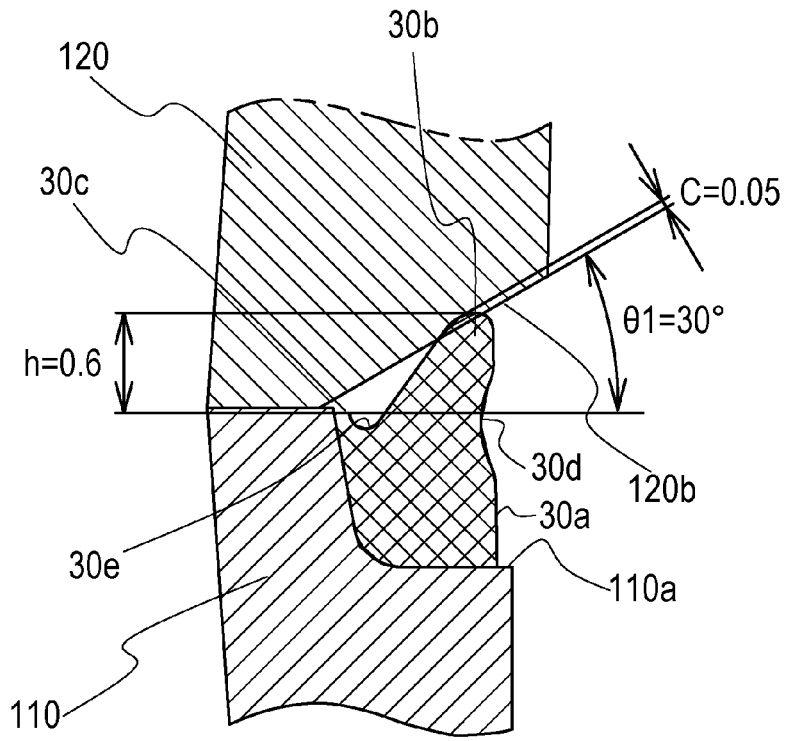
FIGS. 7A and 7B are diagrams illustrating the dimensions of components of a waterproof structure.
Figure 7B:
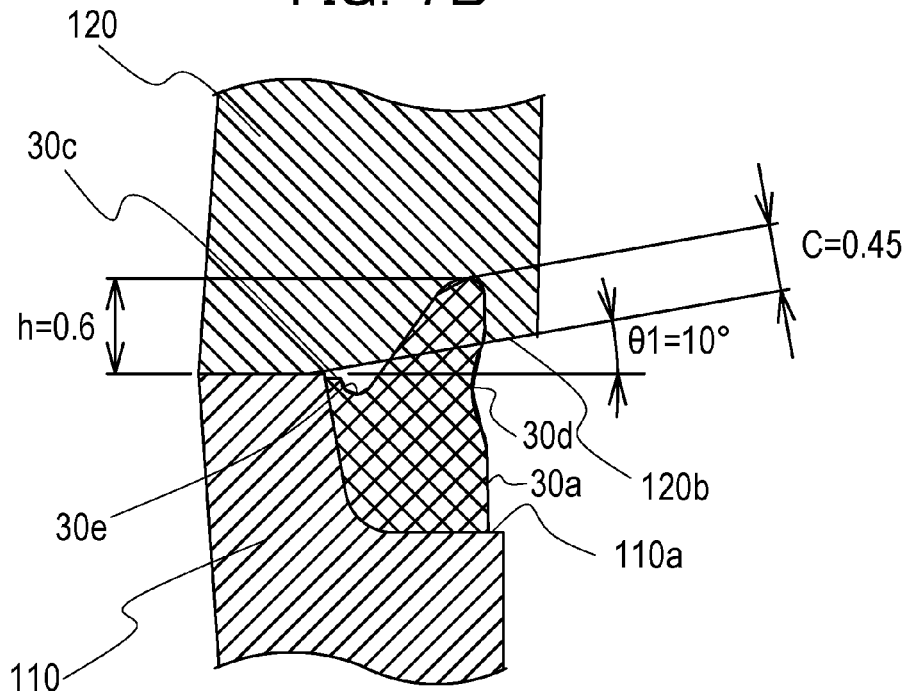

Moreover, the overlap amount C between the lip section 30b and the inclined surface 120b can be appropriately set within the range from c=0.05 mm illustrated in FIG. 7A to c=0.45 mm illustrated in FIG. 7B. Here, as illustrated in FIG. 6, the overlap amount C is set to be the distance between a segment S1 extending from the inclined surface 120b and a segment S2 which is parallel to the segment S1 and which contacts the top of the lip section 30b. With the angle θ1 unchanged, increasing the overlap amount C increases a repulsive force exerted by the lip section 30b when the first enclosure section 110 and the second enclosure section 120 are combined together.

The angle θ1 between the mating surface 120a and the inclined surface 120b can be appropriately set within the range from θ1=30° illustrated in FIG. 7A to θ1=10° illustrated in FIG. 7B. With the overlap amount C unchanged, reducing the angle θ1 increases the repulsive force exerted by the lip section 30b when the first enclosure section 110 and the second enclosure section 120 are combined together.

If the overlap amount C=0.05 and θ1=30° as illustrated in FIG. 7A, the appropriate waterproof property can be ensured, for example, under a water pressure condition (10 kPa) established at a water depth of 1 m. On the other hand, if the overlap amount C=0.45 and θ1=10° as illustrated in FIG. 7B, a sufficient margin for the appropriate waterproof property can be ensured. In this condition, even if misalignment or a gap occurs between the first enclosure section 110 and the second enclosure section 120, the appropriate waterproof property can be ensured.

The waterproof structure of the openable and closable enclosure 100 has been described. As illustrated in FIG. 4, the fixed enclosure 200 includes a similar waterproof structure. That is, the fixed enclosure 200 has a first enclosure section 210 including an opening in which a gasket installation portion 210a with a frame-like gasket 40 provided thereon is formed. Furthermore, the openable and closable enclosure 100 has a second enclosure section 220 disposed opposite the first enclosure section 210 and which tightly contacts the gasket 40 provided in the first enclosure section 210.

Thus, the waterproof structure of the fixed enclosure 200 is similar to that of the openable and closable enclosure 100 and will thus not be described below in detail.

The first enclosure section 210 includes a threaded hole 210a. The second enclosure section 220 includes a threaded hole 220a. The first enclosure section 210 and second enclosure section 220 combined together are fixed to each other via a screw 240. Furthermore, a battery cover 230 is installed on the first enclosure section 210.

Now, the operation of the waterproof structure according to the present embodiment will be described.

FIG. 8A illustrates that the inclined surface 120b of the second enclosure section 120 is in contact with the tip portion of the lip section 30b. FIG. 8B illustrates that the first enclosure section 110 and the second enclosure section 120 are combined together, that is, the mating surface 110b of the first enclosure section 110 is in contact with the mating surface 120a of the second enclosure section 120. FIG. 8C is a graph illustrating the relationship between the press-in amount by which the second enclosure section 120 needs to be pressed in to shift the condition illustrated in FIG. 8A to the condition illustrated in FIG. 8B and the repulsive force exerted by the lip section 30b during the shift. Here, the press-in amount corresponds to the distance between the mating surface 110b and the mating surface 120a. The condition illustrated in FIG. 8A is assumed to be an initial condition (origin). Then, as the mating surface 120a in the condition illustrated in FIG. 8A moves closer to the mating surface 110b, the press-in amount increases.

Figure 9:
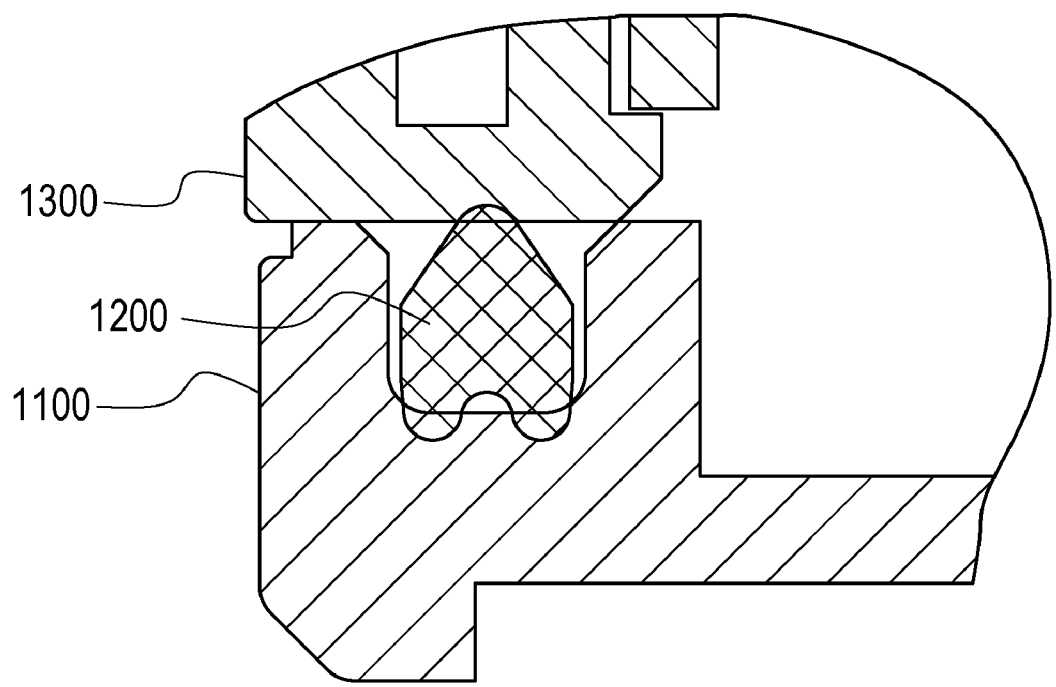
FIG. 9 is a diagram illustrating the periphery of a gasket in a comparative example.

FIG. 8C illustrates an example of a repulsive force in a waterproof structure illustrated in FIG. 9 as a comparative example. The repulsive force in the comparative example is illustrated by a dashed line in FIG. 8C. In the waterproof structure illustrated in FIG. 9, the waterproof property is ensured by pressing a second enclosure section 1300 against a gasket 1200 installed on a first enclosure section 1100.

In a region (a) in FIG. 8C, the lip section 30b in the waterproof structure in the present embodiment is collapsed when the inclined surface 120b is pressed against the lip section 30b. Thus, the repulsive force increases linearly. Then, in a region (b) in FIG. 8C, the lip section 30b being pressed by the inclined surface 120b is gradually tilted. At this time, the lip section 30b is slightly collapsed, but the increase rate of the collapse amount is very low compared to that in the region (a). Thus, the repulsive force in the region (b) follows an almost horizontal track as illustrated in FIG. 8C. The press-in amount increases beyond the region (b) and enters a region (c). Then, the increase rate of the collapse amount increases again consistently with the press-in amount. As a result, the increase rate of the repulsive force increases.

The waterproof structure according to the present embodiment is designed so as to allow the repulsive force illustrated in the region (b) to be exerted when the first enclosure section 110 and the second enclosure section 120 are combined together. That is, the waterproof structure is designed so as to allow the press-in amount corresponding to the terminal of the region (b) to be exerted when the first enclosure section 110 and the second enclosure section 120 are combined together. Thus, the repulsive force can be kept almost uniform even when the second enclosure section 120 floats slightly or the first enclosure section 110 and the second enclosure section 120 are misaligned, thus changing the press-in amount. That is, the pressing force can be stably exerted, thus ensuring the appropriate waterproof property. Furthermore, even with a decrease in press-in amount, the tilted lip section 30b acts to return to the initial condition so as to follow the inclined surface 120b. This also serves to maintain the appropriate waterproof property.

On the other hand, even when the second enclosure section 1300 with no tapered inclined surface is pressed against the gasket 1200 in the comparative example, the gasket 1200 is not tilted but is only collapsed. Thus, the repulsive force of the gasket 1200 increases almost in proportion to the press-in amount. Consequently, when the first enclosure section 1100 and the second enclosure section 1300 are misaligned, the repulsive force and thus the waterproof property vary significantly. In view of such behavior of the gasket 1200, settings for increasing the repulsive force are required to ensure the appropriate waterproof property. However, increasing the repulsive force increases the force exerted on the second enclosure section 1300, resulting in the need to ensure the high strength of the second enclosure section 1300. This is disadvantageous for a reduction in enclosure size.

As described above, the waterproof structure according to the present embodiment includes the tapered inclined surface 120b, which tilts the lip section 30b. Thus, a stable pressing force is ensured, thus offering the appropriate waterproof property.

Now, a second embodiment of the present invention will be described with reference to FIG. 10A-10C. The inclined surface 120b of the waterproof structure in the above-described first embodiment is provided all over the periphery of the second enclosure section 120. The angle $\theta 1$ between the inclined surface 120b and the mating surface 120a is uniform all over the periphery.

In contrast, in the second embodiment, the angle $\theta 1$ is varied depending on the position on the gasket 30. The reason is as described below. The second embodiment is the same as the first embodiment except for the variation in $\theta 1$. Thus, the same reference numerals as those in the first embodiment are used in the second embodiment. The detailed description of the components is omitted.

The gasket 30 is shaped like a frame extending along the outer peripheral shape of the first enclosure section 110 as illustrated in the plan view in FIG. 10A. The gasket 30 has a plurality of convex parts and four corner parts. The convex parts are convexed toward inward the first enclosure section 110, that is, with respect to the opening of the first enclosure section 110. On the other hand, the corners are convexed outward from the first enclosure section 110, that is, concaved with respect to the opening of the first enclosure section 110. The gasket 30 is pulled at the protruding parts, or contracted at the corners. Thus a repulsive force at the protruding parts and corners is different from that of linear parts of the gasket 30. This makes the pressing force exerted on the inclined surface 120b of the gasket 30 nonuniform.

As illustrated in FIG. 10B, the angle $\theta 1$ of the second enclosure section 120 with respect to portions of the frame-like gasket 30 shaped to protrude inward is set to be smaller than that with respect to linear parts of the gasket 30. The gasket 30 is pulled at the inward protruding portions. Consequently, the repulsive force is reduced. Thus, the angle $\theta 1$ of the inclined surface 120b is set to $\theta 1-$ so as to increase the pressing force exerted on the lip section 30b. Consequently, the value of the pressing force exerted on the inward protruding portions can be made closer to that of the pressing force exerted on the surrounding linear part.

Second, as illustrated in the enlarged diagram in FIG. 10C, the angle $\theta 1$ of the second enclosure section 120 with respect to portions of the frame-like gasket 30 shaped to protrude outward is set to be larger than that with respect to the linear parts of the gasket 30. The gasket 30 is compressed at the outward protruding portions. Consequently, the repulsive force is increased. Thus, the angle $\theta 1$ of the inclined surface 120b is set to $\theta 1+$ so as to reduce the pressing force exerted on the lip section 30b. Consequently, the value of the pressing force exerted on the inward protruding portion can be made closer to that of the pressing force exerted on the surrounding linear part.

The above-described gasket 30 can be entirely subjected to a uniform pressing force. As a result, the waterproof property can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present inventions have been described in detail, it should be understood that various changes, substitutions, and alterations could be made hereto without departing from the spirit and scope of the invention.

The invention claimed is:

1. A waterproof enclosure comprising:
    a first enclosure section including a gasket which is provided on a gasket installation portion provided along with an opening, the gasket including a body section and a lip section protruding from the body section; and
    a second enclosure section including a planar surface which contacts the first enclosure section and an inclined surface which contacts the lip section of the gasket,
    wherein the lip section is configured to have an angle equal or less than 90 degrees with respect to the planar surface.

2. The waterproof enclosure according to claim 1, wherein the angle of the lip section is greater than an angle of the inclined surface of the second enclosure section with respect to the planar surface of the second enclosure section.

3. The waterproof enclosure according to claim 2, wherein the gasket includes a convex part with respect to the opening of the first enclosure section and a linear part; and the inclined surface of a first portion of the second enclosure section facing the convex part is set to have a smaller angle than a second portion of the second enclosure section facing the linear part.

4. The waterproof enclosure according to claim 2, wherein the gasket includes a concave part with respect to the opening of the first enclosure section and a linear part; and the inclined surface of a first portion of the second enclosure section facing the concave part is set to have a greater angle than a second portion of the second enclosure section facing the linear part.

5. The waterproof enclosure according to claim 1, wherein the gasket includes a groove provided at a root of the lip section.

6. The waterproof enclosure according to claim 1, wherein an end portion of the lip section is positioned outward with respect to an inner periphery of the body section of the gasket before the inclined surface of the second enclosure contacts the lip section of the gasket.

7. The waterproof enclosure according to claim 1, wherein the gasket and the first enclosure section are integrally molded.

8. An electronic apparatus in which a waterproof enclosure is installed comprising;
    a first enclosure section including a gasket which is provided on a gasket installation portion provided along with an opening, the gasket including a body section and a lip section protruding from the body section;
    a substrate with an electric component housed in the first enclosure; and
    a second enclosure section including a planar surface which contacts with the first enclosure section and an inclined surface which contacts with the lip section of the gasket,
    wherein the lip section is configured to have an angle equal or less than 90 degrees with respect to the planar surface.

* * * * *